United States Patent [19]
Yamashita

[11] Patent Number: 5,610,605
[45] Date of Patent: Mar. 11, 1997

[54] ANALOG/DIGITAL CONVERTING CIRCUIT

[75] Inventor: Eizo Yamashita, Itami, Japan

[73] Assignee: Mitsubishi Denki Kabushiki Kaisha, Tokyo, Japan

[21] Appl. No.: 346,169

[22] Filed: Nov. 21, 1994

[30] Foreign Application Priority Data

Dec. 1, 1993 [JP] Japan .................................. 5-301710

[51] Int. Cl.⁶ ...................................................... H03M 1/18
[52] U.S. Cl. ........................... 341/139; 341/161; 341/163; 341/164; 341/165
[58] Field of Search ..................................... 341/139, 161, 341/163, 164, 165; 340/342

[56] References Cited

U.S. PATENT DOCUMENTS

| | | | |
|---|---|---|---|
| 4,196,419 | 4/1980 | Brown | 340/347 |
| 4,595,884 | 6/1986 | Miller, Jr. | 330/258 |
| 4,641,130 | 2/1987 | Mastroianni | 340/347 |
| 4,748,440 | 5/1988 | Kobayashi | 340/347 |
| 4,851,842 | 7/1989 | Iwamatsu | 341/139 |
| 4,994,808 | 2/1991 | Wichelman | 341/161 |
| 5,017,920 | 5/1991 | French | 341/163 |

FOREIGN PATENT DOCUMENTS 60-57734  12/1985  Japan.

*Primary Examiner*—Jeffrey A. Gaffin
*Assistant Examiner*—Jason H. Vick
*Attorney, Agent, or Firm*—Lowe, Price, LeBlanc & Becker

[57] ABSTRACT

In an analog/digital converting circuit, when an analog input voltage exceeds a reference voltage, the analog input voltage is modified into analog voltages not exceeding the reference voltage, and comparison voltages generated by dividing the reference voltage are compared with the modified analog voltages.

16 Claims, 12 Drawing Sheets

ANALOG/DIGITAL CONVERTING CIRCUIT

BACKGROUND OF THE INVENTION

1. Field of the Invention

The present invention relates to an analog/digital converting circuit which can accurately convert an analog input voltage to a digital value even if the analog input voltage exceeds a reference voltage.

2. Description of Related Art

An example of a conventional analog/digital converting circuit is disclosed in Japanese Patent Publication No. 60-57734 (1985). FIG. 1 is a block diagram showing the structure of the analog/digital converting circuit, in which conversion accuracy is, for example, 4 bits. Between a terminal supplied with a reference voltage $V_{ref}$ and a ground potential point is provided a series circuit including a resistor $11_1$ having a resistance of $(3/2)R$ (wherein R is an appropriate resistance value), 14 resistors $11_2$–$11_{15}$ each having a resistance of R, and a resistor $11_{16}$ having a resistance of $(1/2)R$. Comparison voltages, i.e., voltages at connections a through o of these resistors are applied in parallel to an analog multiplexer 12. The analog multiplexer 12 appropriately selects and outputs the comparison voltages at three points among the connections a through o in accordance with a select code applied from a control circuit 14, which will be described later. At the start of analog/digital converting operation, it automatically selects the comparison voltages at the connections d, h and i.

The comparison voltages at the three points selected by the analog multiplexer 12 is supplied to a first input terminal of each of comparators $13_1$, $13_2$ and $13_3$. Each of the comparators $13_1$, $13_2$ and $13_3$ receives an analog input voltage $AN_{in}$ at a second input terminal in a parallel manner. Comparison output signals $C_1$, $C_2$ and $C_3$ respectively supplied from the comparators $13_1$, $13_2$ and $13_3$ are applied to the control circuit 14 in a parallel manner. The control circuit 14 is provided with a control input terminal 15 which receives a conversion start signal ST for starting the analog/digital conversion, and the control circuit 14 applies a select code to the analog multiplexer 12 when it receives the conversion start signal ST.

Further, in response to the comparison output signals $C_1$, $C_2$ and $C_3$ applied from the comparators $13_1$, $13_2$ and $13_3$ in the parallel manner, the control circuit 14 supplies a digital code corresponding to the comparison output signals C1, $C_2$ and $C_3$. The digital code is identical to the select code applied to the analog multiplexer 12. The digital code supplied from the control circuit 14 is inputted to a latch circuit 16 for temporarily storage, and thereafter is outputted via code terminals $17_1$–$17_4$. Further, the control circuit 14 is provided with a control output terminal 18 supplying a conversion end signal END indicating the end or termination of the analog/digital conversion.

Table 1 shows a relationship between each of the comparison voltages generated at the respective connections a–o of the resistors $11_1$ through $11_{16}$ and each of the digital codes $2^{-1}$, $2^{-2}$, $2^{-3}$ and $2^{-4}$.

TABLE 1

| Connection | Comparison | Voltage | Digital Code | | | |
|---|---|---|---|---|---|---|
| | | | $2^{-1}$ | $2^{-2}$ | $2^{-3}$ | $2^{-4}$ |
| a | 29/32 | Vref | | | | |
| | | | 1 | 1 | 1 | 1 |
| b | 27/32 | Vref | | | | |
| | | | 1 | 1 | 1 | 0 |
| | | | 1 | 1 | 0 | 1 |

TABLE 1-continued

| Connection | Comparison | Voltage | Digital Code | | | |
|---|---|---|---|---|---|---|
| | | | $2^{-1}$ | $2^{-2}$ | $2^{-3}$ | $2^{-4}$ |
| c | 25/32 | Vref | | | | |
| | | | 1 | 1 | 0 | 0 |
| d | 23/32 | Vref | | | | |
| | | | 1 | 0 | 1 | 1 |
| e | 21/32 | Vref | | | | |
| | | | 1 | 0 | 1 | 0 |
| f | 19/32 | Vref | | | | |
| | | | 1 | 0 | 0 | 1 |
| g | 17/32 | Vref | | | | |
| | | | 1 | 0 | 0 | 0 |
| h | 15/32 | Vref | | | | |
| | | | 0 | 1 | 1 | 1 |
| i | 13/32 | Vref | | | | |
| | | | 0 | 1 | 1 | 0 |
| j | 11/32 | Vref | | | | |
| | | | 0 | 1 | 0 | 1 |
| k | 9/32 | Vref | | | | |
| | | | 0 | 1 | 0 | 0 |
| l | 7/32 | Vref | | | | |
| | | | 0 | 0 | 1 | 1 |
| m | 5/32 | Vref | | | | |
| | | | 0 | 0 | 1 | 0 |
| n | 3/32 | Vref | | | | |
| | | | 0 | 0 | 0 | 1 |
| o | 1/32 | Vref | | | | |
| | | | 0 | 0 | 0 | 0 |

The operation of the analog/digital converting circuit will now be described below with reference to Table 1.

When the analog/digital conversion is started by inputting the conversion start signal ST to the control input terminal 15 of the control circuit 14, the comparison voltages $(23/32)V_{ref}$, $(15/32)V_{ref}$ and $(7/32)V_{ref}$ at the connections d, h and l, respectively are selected. Thus, the comparison voltages are selected at the connections d, h and l which quarters the voltage between the reference voltage $V_{ref}$ and the ground potential. The selected comparison voltages are supplied to comparators $13_1$, $13_2$ and $13_3$, respectively. At this point, the analog input voltage $AN_{in}$ to be converted into a digital value is supplied to the second input terminal of each of the comparators $13_1$, $13_2$ and $13_3$, so that the comparators $13_1$, $13_2$ and $13_3$ perform the first comparison between the supplied comparison voltages and the analog input voltage $AN_{in}$.

When the analog input voltage $AN_{in}$ is larger than the comparison voltages selected by the analog multiplexer 12, the result of the first comparison is classified into the following four states (1), (2), (3) and (4) if the comparison output signals $C_1$, $C_2$ and $C_3$ of the comparators $13_1$, $13_2$ and $13_3$ undergo a 0 to 1 transition.

State (1): $C_1$ is at "1" level.

State (2): $C_1$ is at "0" level, and $C_2$ is at "1" level.

State (3): $C_1$ and $C_2$ are at "0" level, and $C_3$ is at "1" level.

State (4): $C_3$ is at "0" level.

The result of the first comparison providing the state (1) is achieved when the analog input voltage $AN_{in}$ is larger than the comparison voltage $(23/32)V_{ref}$ at the connection d, and in this case, the control circuit 14 selects and outputs a digital code "1, 1, 1, 1," for performing the second comparison so as to select the connections a, b, and c quartering the voltage between the reference voltage $V_{ref}$ and the comparison voltage $(23/32)V_{ref}$ at the connection d. When this digital code is supplied to the analog multiplexer 12, the analog multiplexer 12 selects the comparison voltages $(29/32)V_{ref}$, $(27/32)V_{ref}$ and $(25/32)V_{ref}$ at the connections a, b and c shown in Table 1. The selected comparison voltages are supplied to the comparators $13_1$, $13_2$ and $13_3$, respectively.

Thereafter, the second comparison is carried out to compare the comparison voltages supplied to the comparators $13_1$, $13_2$ and $13_3$ with the analog input voltage $AN_{in}$. In this second comparison, if all the comparison output signals $C_1$, $C_2$ and $C_3$ of the comparators $13_1$, $13_2$ and $13_3$ are at the level of "1", the control circuit 14 determines that the analog input voltage $AN_{in}$ is larger than the comparison voltage $(29/32)V_{ref}$ at the connection a, and continues to output the same digital code as that already outputted.

The latch circuit 16 temporarily stores the supplied digital code "1, 1, 1, 1", and then outputs it via the terminals $17_1$–$17_4$. As a result, the second comparison performs the analog/digital conversion of the analog input voltage $AN_{in}$ into the digital code "1, 1, 1, 1". Further, when the second comparison shows the result of comparison output signals $C_1$ at "0" level and $C_2$ and $C_3$ at "1" level, the control circuit 14 determines that the analog input voltage $AN_{in}$ is smaller than the comparison voltage $(29/32)V_{ref}$ at the connection a and is larger than the comparison voltage $(27/32)V_{ref}$ at the connection b, and thus it changes only $2^{-3}$ and $2^{-4}$ of the digital code, which was previously outputted, into "1, 0" so as to select the connections b, c and d quartering the voltage between the comparison voltage $(29/32)V_{ref}$ at the connection a and the comparison voltage $(23/32)V_{ref}$ at the connection e, and outputs the same. Thus, the control circuit 14 outputs a digital code "1, 1, 1, 0".

When the second comparison provides the result of comparison output signal $C_1$ and $C_2$ at "0" level and $C_3$ at "1" level, the control circuit 14 determines that the analog input voltage $AN_{in}$ is smaller than the comparison voltage $(27/32)V_{ref}$ at the connection b but is larger than the comparison voltage $(25/32)V_{ref}$ at the connection c, and thus it changes only $2^{-3}$ and $2^{-4}$ of the digital code, which was previously outputted, into "0, 1" so as to select the connections c, d and e quartering the voltage between the comparison voltage $(27/32)V_{ref}$ at the connection b and the comparison voltage $(19/32)V_{ref}$ at the connection f, and outputs the same. Thus, the control circuit 14 outputs a digital code "1, 1, 0, 1".

When the second comparison provides the result of comparison output signals $C_1$, $C_2$ and $C_3$ at "0" level, the control circuit 14 determines that the analog input voltage $AN_{in}$ is smaller than the comparison voltage $(25/32)V_{ref}$ at the connection c but is larger than the comparison voltage $(23/32)V_{ref}$ at the connection d, and thus it changes only $2^{-3}$ and $2^{-4}$ of the digital code, which was previously outputted, into "0, 0" so as to select the connections d, e and f quartering the voltage between the comparison voltage $(25/32)V_{ref}$ at the connection c and the comparison voltage $(17/32)V_{ref}$ at the connection g, and outputs the same. Thus, the control circuit 14 outputs a digital code "1, 1, 0, 0".

After the second comparison, the latch circuit 16 temporarily stores the supplied digital code and thereafter outputs it via the code terminals $17_1$–$17_4$.

Meanwhile, when the result of the first comparison exhibits the state (2), i.e., $C_1$ at "0" level and $C_2$ at "1" level, the analog input voltage $AN_{in}$ is smaller than the comparison voltage $(23/32)V_{ref}$ at the connection d but is larger than the comparison voltage $(15/32)V_{ref}$ at the connection h. In this case, the control circuit 14 outputs a digital code "1, 0, 1, 1" for performing the second comparison so as to select the connections e, f and g quartering the voltage between the comparison voltage $(23/32)V_{ref}$ at the connection d and the comparison voltage $(15/32)V_{ref}$ at the connection h. When the digital code is supplied to the analog multiplexer 12, the analog multiplexer 12 selects the comparison voltages $(21/32)V_{ref}$, $(19/32)V_{ref}$ and $(17/32)V_{ref}$, respectively at the connections e, f and g.

The comparison voltages thus selected are supplied to the comparators $13_1$, $13_2$ and $13_3$, respectively. Thereafter, the comparators $13_1$, $13_2$ and $13_3$ perform the second comparison between the inputted comparison voltages and the analog input voltage $AN_{in}$, similarly to the aforementioned case. In the second comparison, when at least the comparison output signal $C_1$ among the comparison output signals $C_1$, $C_2$ and $C_3$ of the comparators $13_1$, $13_2$ and $13_3$ is at the "1" level, the control circuit 14 determines that the analog input voltage $AN_{in}$ is larger than the comparison voltage $(21/32)V_{ref}$ at the connection e, and continues to output the digital code "1, 0, 1, 1", which was previously outputted, so as to select the connections f, g and h quartering the voltage between the comparison voltage $(21/32)V_{ref}$ at the connection e and the comparison voltage $(13/32)V_{ref}$ at the connection i.

When the second comparison exhibits the result of comparison output signals $C_1$ at "0" level and $C_2$ and $C_3$ at "1" level, the control circuit 14 determines that the analog input voltage $AN_{in}$ is smaller than the comparison voltage $(21/32)V_{ref}$ at the connection e but is larger than the comparison voltage $(19/32)V_{ref}$ at the connection f, and thus it changes only $2^{-3}$ and $2^{-4}$ of the digital code, which was previously outputted, into "1, 0" so as to select the connections f, g and h quartering the voltage between the comparison voltage $(21/32)V_{ref}$ at the connection e and the comparison voltage $(13/32)V_{ref}$ at the connection i, and outputs the same. Thus, the control circuit 14 outputs a digital code "1, 0, 1, 0".

When the second comparison exhibits the result of comparison output signals $C_1$ and $C_2$ at "0" level and $C_3$ at "1" level, the control circuit 14 determines that the analog input voltage $AN_{in}$ is smaller than the comparison voltage $(19/32)V_{ref}$ at the connection f but is larger than the comparison voltage $(17/32)V_{ref}$ at the connection g, and thus it changes only $2^{-3}$ and $2^{-4}$ of the digital code, which was previously outputted, into "0, 1" so as to select the connections g, h and i quartering the voltage between the comparison voltage $(19/32)V_{ref}$ at the connection f and the comparison voltage $(11/32)V_{ref}$ at the connection j, and outputs the same. Thus, the control circuit 14 outputs a digital code "1, 0, 0, 1".

If the second comparison exhibits the result of comparison output signals $C_1$, $C_2$ and $C_3$ at "0" level, the control circuit 14 determines that the analog input voltage $AN_{in}$ is smaller than the comparison voltage $(17/32)V_{ref}$ at the connection g but is larger than the comparison voltage $(15/32)V_{ref}$ at the connection h, and thus it changes only $2^{-3}$ and $2^{-4}$ of the digital code, which was previously outputted, into "0, 0" so as to select the connections h, i and j quartering the voltage between the comparison voltage $(17/32)V_{ref}$ at the connection g and the comparison voltage $(9/32)V_{ref}$ at the connection k, and outputs the same. Thus, the control circuit 14 outputs a digital code "1, 0, 0, 0".

After the second comparison, the digital code inputted into the latch circuit 16 is temporarily stored, and then is outputted via the terminals $17_1$–$17_4$. Then, the operation will be performed similarly. More specifically, when the result of comparison after the first comparison exhibits the state (3) or (4), the control circuit 14 outputs a digital code "0, 1, 1, 1" or a digital code "0, 0, 1, 1", and thereafter the analog multiplexer 12 selects the respective comparison voltages at the connections i, j and k, or the respective comparison voltages at the connections m, n and o. In accordance with the comparison output signals $C_1$, $C_2$ and $C_3$ of the comparators $13_1$, $13_2$ and $13_3$, the control circuit 14 outputs one of the digital code of 4 bits shown in Table 1. As a result, the latch circuit 16 outputs the digital code corresponding to the analog input voltage $AN_{in}$.

When the latch circuit 16 completes the output of the 4-bit digital code via the code terminals $17_1$–$17_4$ after the second comparison, the control circuit 14 outputs the conversion end signal END via the control output terminal 18.

As described above, the conventional analog/digital converting circuit operates within a range from the ground potential to the reference voltage, and decompose the analog input voltage with accuracy of n bits (wherein n is a natural number) for converting an analog voltage into a digital value. This results in such a disadvantage that an analog input voltage cannot be accurately converted into a digital value, if the analog input voltage exceeds the reference voltage.

SUMMARY OF THE INVENTION

The invention has been developed in order to overcome the above problem, and it is an object of the invention to provide an analog/digital converting circuit which can accurately convert an analog voltage into a digital value even if the analog input voltage exceeds a reference voltage.

An analog/digital converting circuit according to the invention includes a voltage modifying and comparing unit which modifies an analog input voltage into analog voltages having values different from that of the analog input voltage based on the analog input voltage and a reference voltage, and compares the converted analog voltages with the reference voltage to select and output the analog voltages based on the result of the comparison.

Therefore, one of the analog voltages of the analog input voltage not exceeding the reference voltage is selected and digitally converted, and any of the analog voltages of the analog input voltage exceeding the reference voltage is digitally converted in the modification thereof.

Another object of the invention is to reduce a current consumption by cutting off the current when analog/digital conversion is not performed.

An analog/digital converting circuit according to the invention includes a voltage modifying and comparing unit which modifies an analog input voltage into analog voltages having values different from that of the analog input voltage based on the analog input voltage and a reference voltage, and compares the converted analog voltages with the reference voltage to select and output one of the analog voltages based on the result of the comparison, wherein a signal for supplying/cutting the analog input voltage and the reference voltage is applied thereto.

Therefore, by application of the signal for supplying/cutting the analog input voltage and the reference voltage, the analog input voltage and the reference voltage can be cut off to reduce the current consumption.

Still another object of the invention is to obtain an accurate value of the converted analog voltage for improving the accuracy of the analog/digital conversion.

In an analog/digital converting circuit according to the invention, the voltage modifying and comparing unit is provided with a circuit including resistors and transistors of the same number as that of the resistors. Further, the voltage modifying and comparing unit is provided with a circuit including transistors of the same number as that the resistors, which are not directly grounded.

Therefore, a ratio between resistances of k resistors and one resistor accurately goes to k, resulting in increase of the analog/digital conversion accuracy. Since the transistors are not directly grounded, no influence by an on-resistance due to back gate effect is not applied, which also improves the analog/digital conversion accuracy.

Yet another object of the invention is to stabilize the accuracy of the analog/digital conversion by preventing lowering of the analog input voltage.

An analog/digital converting circuit according to the invention includes a voltage modifying and comparing unit which modifies an analog input voltage into analog voltages having values different from that of the analog input voltage based on the analog input voltage and a reference voltage, and compares the converted analog voltages with the reference voltage to select and output one of the analog voltages based on the result of the comparison, and an impedance converter for inputting the analog voltage into the voltage modifying and comparing unit.

According to the above structure, since an output impedance of the impedance converter is small, it is possible to prevent lowering of the analog input voltage which may be caused by change of a current flowing through a resistor provided at the voltage modifying and comparing unit, and thus the analog input voltage inputted into the voltage modifying and comparing unit can be stabilized.

An analog/digital converting circuit according to the invention includes a voltage modifying and comparing unit which modifies an analog input voltage into analog voltages having values different from that of the analog input voltage based on the analog input voltage and a reference voltage, and compares the converted analog voltages with the reference voltage to select and output one of the analog voltages based on the result of the comparison, and an impedance converter for outputting the analog voltage to be outputted from the voltage modifying and comparing unit to a comparator.

According to the above structure, since an output impedance of the impedance converter is small, an analog voltage inputted into the comparator can be stabilized.

The above and further objects and features of the invention will more fully be apparent from the following detailed description with accompanying drawings.

DESCRIPTION OF THE PREFERRED EMBODIMENTS

Embodiments of the invention will be described below with reference to the drawings.

EMBODIMENT 1

Figure 1:
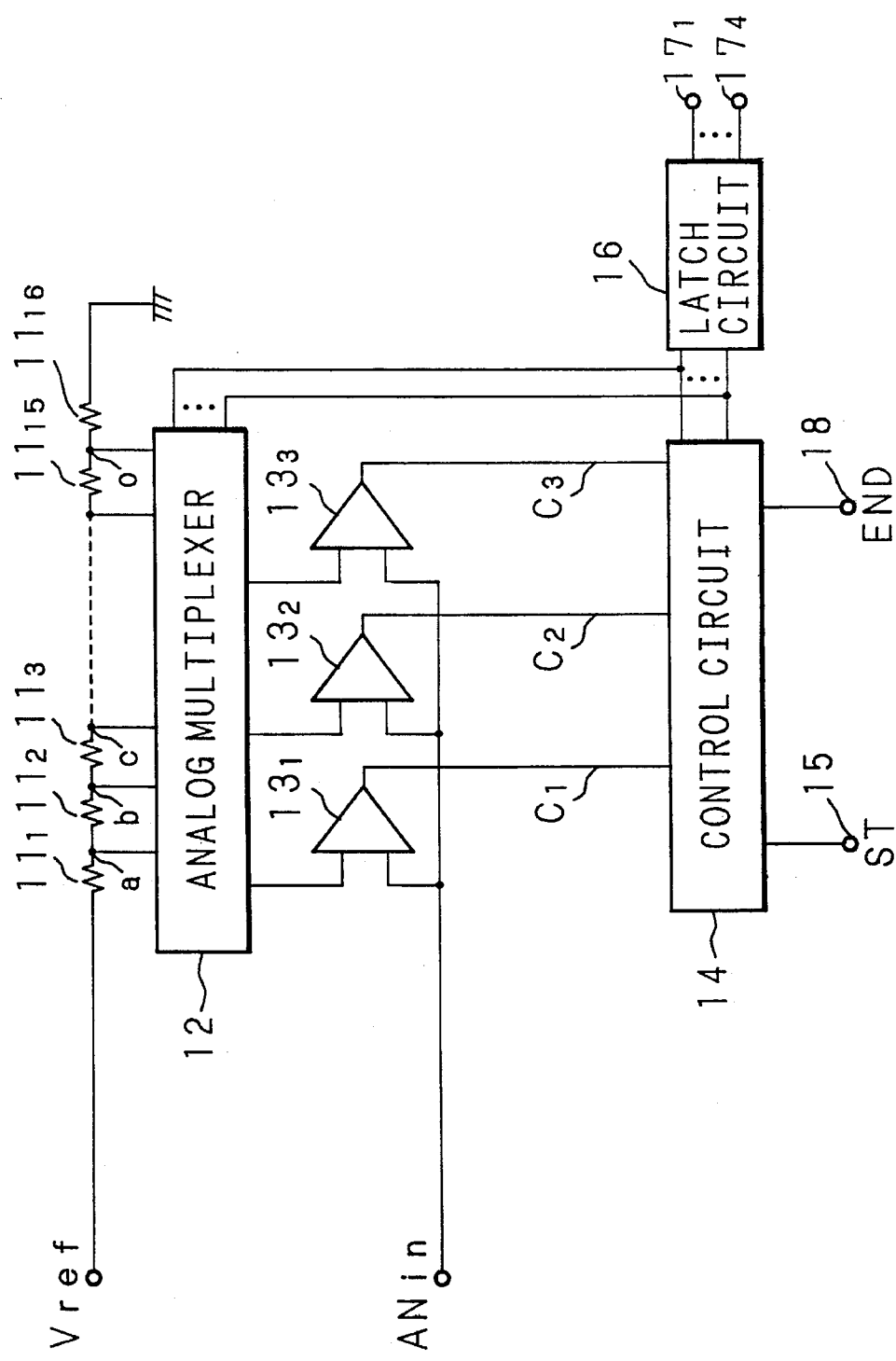
FIG. 1 is a block diagram showing the structure of a conventional analog/digital converting circuit.
Figure 2:
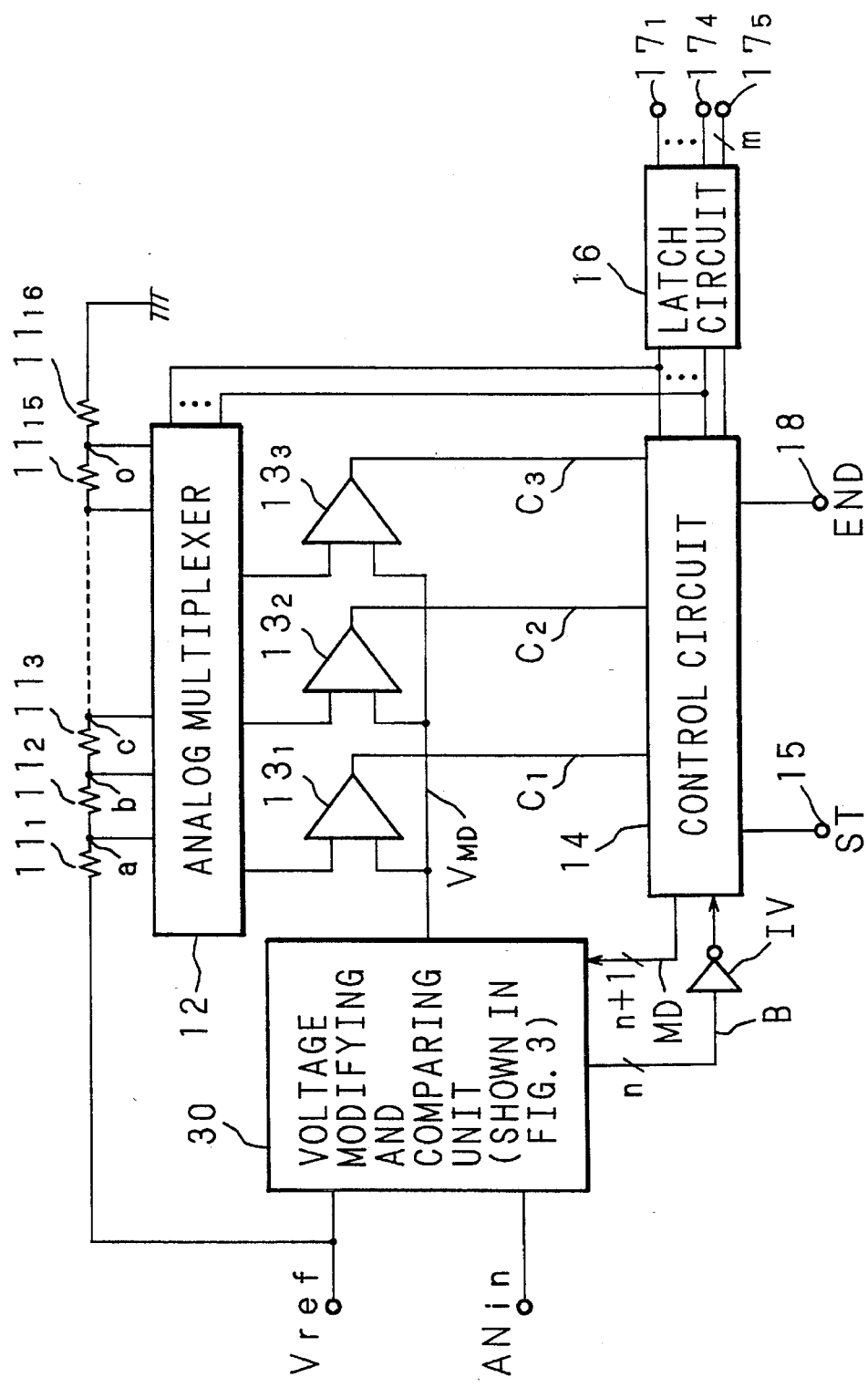
FIG. 2 is a block diagram showing the structure of an analog/digital converting circuit of embodiment 1 according to the invention.

FIG. 2 is a block diagram showing the structure of an analog/digital converting circuit of embodiment 1 according to the invention. For the sake of illustration, the structure shown therein has a conversion accuracy of 4 bits. Between a terminal receiving a reference voltage $V_{ref}$ and a ground potential is provided a series circuit which includes a resistor $11_1$ having a resistance of $(\%)R$ (wherein R is an appropriate resistance value), 14 resistors $11_2-11_{15}$ each having a resistance of R, and a resistor $11_{16}$ having a resistance of $(\frac{1}{2})R$. Comparison voltages, i.e., voltages at connections a through o of the respective resistors $11_1$ through $11_{15}$ are applied in parallel to an analog multiplexer 12. The analog multiplexer 12 selects and outputs the comparison voltages at appropriate three points among the connections a–o in accordance with a select code applied from a control circuit 14 which will be described later. At the start of analog/digital converting operation, it automatically selects the comparison voltages at the connections d, h and i.

The comparison voltages at the three points selected by the analog multiplexer 12 are respectively supplied to a first input terminal of each of comparators $13_1$, $13_2$ and $13_3$. A reference voltage $V_{ref}$ and an analog input voltage $AN_{in}$ are supplied to a voltage modifying and comparing unit 30 provided with a voltage modifying circuit 19 and a voltage comparator 20, which will be described later. By comparing magnitudes of the reference voltage $V_{ref}$ and the analog input voltage $AN_{in}$, the voltage modifying and comparing unit 30 outputs a voltage comparison result signal B of n bits, which is supplied to the control circuit 14 via an inverter IV. The inverter IV is provided for the following purpose: Since outputs of comparators $20_1-20_n$, which are used for controlling the control circuit 14 and will be described later, undergo 1 to 0 transition in the case of $AN_{in}-kV_{ref}<V_{ref}$, the signal at "1" level must be supplied to the control circuit 14 which performs the control operation in response to an active signal at "1" level. The control circuit 14 is operable to output a voltage select signal MD of (n+1) bits in accordance with the voltage comparison result signal B applied thereto, and the voltage select signal MD is supplied to the voltage modifying and comparing unit 30.

The received voltage select signal MD is modified into an analog input voltage $V_{MD}$, which is supplied in parallel to a second terminal of each of the comparators $13_1$, $13_2$ and $13_3$. The comparators $13_1$, $13_2$ and $13_3$ compare the supplied comparison voltages with the modified input voltage $V_{MD}$, and supplies the result of comparison, i.e., comparison output signals $C_1$, $C_2$ and $C_3$ to the control circuit 14. The control circuit 14 is provided with a control input terminal 15 which receives a conversion start signal ST for starting the analog/digital conversion. When the conversion start signal ST is applied to the control input terminal 15, the control circuit 14 supplies a select code to the analog multiplexer 12.

Further, the control circuit 14 is operable to receive the comparison output signals $C_1$, $C_2$ and $C_3$ applied in parallel from the comparators $13_1$, $13_2$ and $13_3$, and output a digital code corresponding to the comparison output signals $C_1$, $C_2$ and $C_3$. The digital code is identical to the select code applied to the analog multiplexer 12. The digital code supplied from the control circuit 14 is inputted to a latch circuit 16 for temporary storage, and then is outputted via code terminals $17_1-17_4$. The voltage comparison result signal B is inputted to and stored at the latch circuit 16, as it is, through the control circuit 14, and then is applied to a code terminal $17_5$ via a code line of m bits (wherein m is a minimum natural number satisfying $n<2^m$) to be outputted from the code terminal $17_5$. If the analog input voltage $AN_{in}$ exceeds the reference voltage $V_{ref}$, the signal exhibits, in order to carry out the analog/digital conversion, how many times of the value of the reference voltage $V_{ref}$ is subtracted from the analog input voltage $AN_{in}$. Further, the control circuit 14 is provided with a control output terminal 18 for outputting a conversion end signal END representing the termination of the analog/digital conversion.

Figure 3:
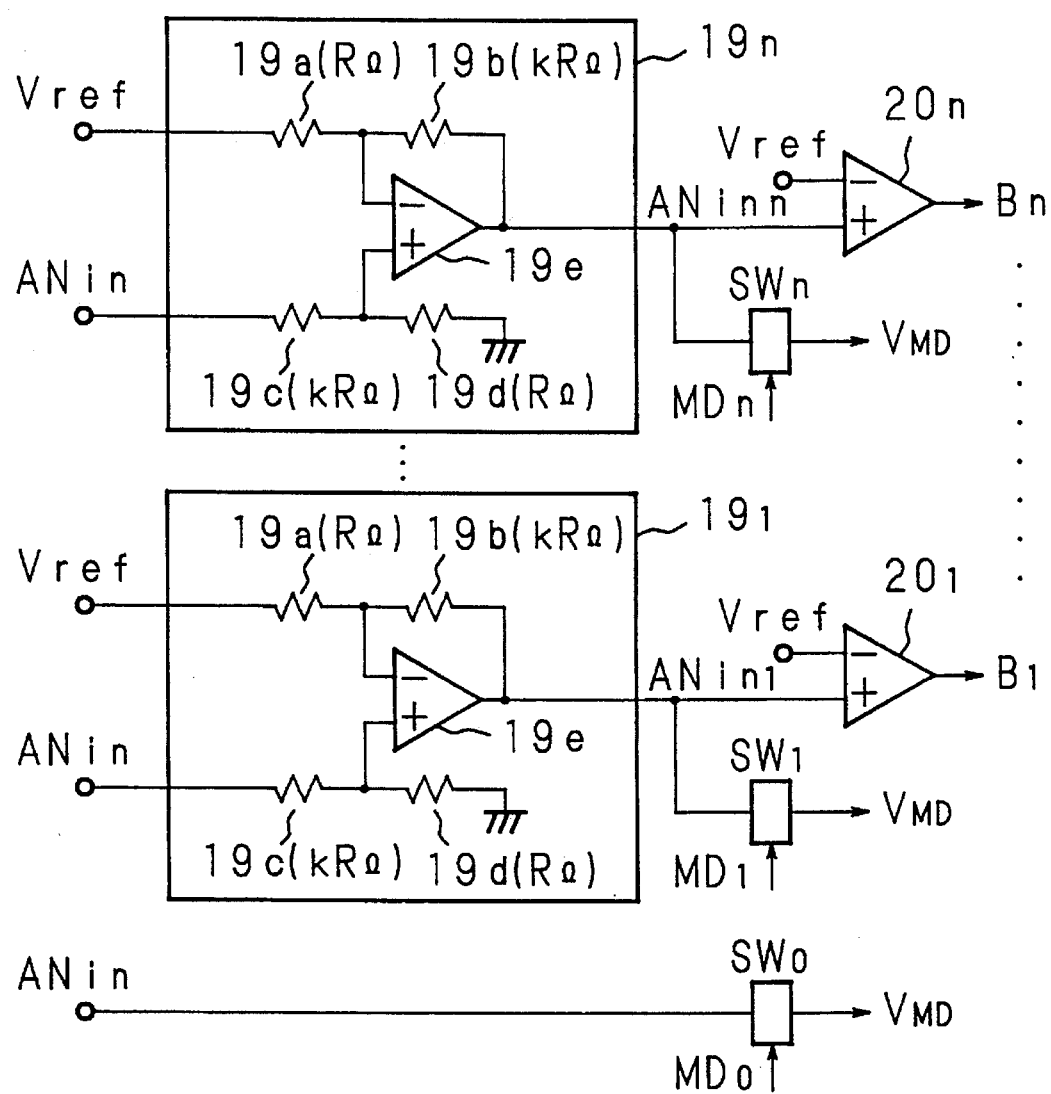
FIG. 3 is a block diagram showing the structure of a voltage modifying and comparing unit of embodiment 1.

FIG. 3 is a block diagram showing the structure of the voltage modifying and comparing unit 30.

In each of n voltage modifying circuits $19_1-19_n$, the terminal receiving the reference voltage $V_{ref}$ is connected to a negative input terminal of a differential amplifier $19_e$ of a zero-cross type via a first resistor having a resistance of $R\Omega$, i.e., a resistor $19_a$, and the negative input terminal is connected to an output terminal of the differential amplifier $19_e$ via a second resistor $19_b$ of a resistance $kR\Omega$ (wherein k is a natural number in a range from 1 to n ($1 \leq k \leq n$)), i.e., a resistor $19_b$. In each of the n voltage modifying circuits $19_1-19_n$, a terminal receiving the analog input voltage $AN_{in}$ is connected to a positive input terminal of the differential amplifier $19_e$ via a third resistor having a resistance of $kR\Omega$, i.e., a resistor $19_c$, and a positive input terminal is grounded via a fourth resistor having a resistance of $R\Omega$, i.e., a resistor $19_d$.

An output terminal of the differential amplifier $19_e$ in the voltage modifying circuit $19_1$ is connected to a positive input terminal of a comparator $20_1$, i.e., a voltage comparator, and a switch $SW_1$. A negative input terminal of the comparator $20_1$ is supplied with the reference voltage $V_{ref}$. The comparator $20_1$ outputs a voltage comparison result signal $B_1$, and a modified input voltage $V_{MD}$ is outputted via the switch $SW_1$. A terminal receiving the analog input voltage $AN_{in}$ is connected to a switch $SW_0$, from which the analog input voltage $AN_{in}$ is outputted as the modified input voltage $V_{MD}$.

The voltage modifying circuits $19_2-19_n$ other than the voltage modifying circuit $19_1$ as well as the comparators $20_2-20_n$ connected thereto have the same structures. The switches $SW_0-SW_n$ are selectively turned on and off by voltage select signals $MD_1-MD_n$ which are supplied from the control circuit 14 in accordance with the voltage comparison result signal B.

The operation of the analog/digital converting circuit thus constructed will now be described below with reference to the aforementioned Table 1. In the analog/digital converting operation which starts in accordance with input of the conversion start signal ST to the control input terminal 15 of the control circuit 14, the comparison voltages $(23/32)V_{ref}$, $(15/32)V_{ref}$ and $(7/32)V_{ref}$ at the connections d, h and l are first selected. Thus, the comparison voltages at the connections d, h and l quartering the voltage between the reference voltage $V_{ref}$ and the ground potential are selected. The comparison voltages thus selected are supplied to the comparators 13$_1$, 13$_2$ and 13$_3$, respectively. At the same point, each of the comparators 13$_1$, 13$_2$ and 13$_3$ receives at a second input terminal the analog voltage which is modified for conversion into a digital value and will be referred to as a "modified input voltage" hereinafter. Thereby, the comparators 13$_1$, 13$_2$ and 13$_3$ carries out the first comparison between the inputted comparison voltages and the modified input voltage $V_{MD}$.

Meanwhile, when the reference voltage $V_{ref}$ and the analog input voltage $AN_{in}$ are supplied to the voltage modifying circuits 19$_1$–19$_n$ of the voltage modifying and comparing unit 30, each of the differential amplifiers 19$_e$ outputs a voltage with a value obtained by $AN_{in}$–$kV_{ref}$. When the value of k is varied in a stepwise fashion, the respective differential amplifiers output the analog voltages which are different in a stepwise manner. For example, the first voltage modifying circuit 19$_1$ outputs a voltage $AN_{in1}$ of $AN_{in}$–$V_{ref}$. The second voltage modifying circuit 19$_2$ outputs a voltage of $AN_{in}$–$2V_{ref}$. The comparators 20$_1$–20$_n$ compares the magnitudes of the voltages $AN_{in1}$–$AN_{inn}$ thus supplied from the differential amplifiers and the reference voltage $V_{ref}$, whereby digital values of the voltage comparison result signals $B_1$–$B_n$ as the result of comparison can be obtained. Thus, a comparator in which $AN_{in}$–$kV_{ref}$ is below the reference voltage $V_{ref}$ generates an output at "0" level, and a comparator in which $ANi$–$kV_{ref}$ is equal to or above the reference voltage $V_{ref}$ generates an output at "1" level. Therefore, it is determined how many times of the value of the reference voltage $V_{ref}$ is required to be subtracted from the analog input voltage $AN_{in}$ at the point where the values of the voltage comparison result signals $B_1$–$B_n$ change from "1" to "0", in order to attain the value of $AN_{in}$–$kV_{ref}$ satisfying $0 \leq AN_{in}$–$kV_{ref} \leq V_{ref}$.

In this manner, the digital values of the voltage comparison result signals $B_1$–$B_n$ corresponding to the analog input voltage $AN_{in}$ can be obtained. When the voltage comparison result signals $B_1$–$B_n$ are applied to the control circuit 14, the control circuit 14 applies the voltage select signal MD of (n+1) bits to the switches $SW_0$–$SW_n$ for selecting one of the switches $SW_0$–$SW_n$ in order to output, as the modified input voltage $V_{MD}$, the analog input voltage or the output voltage of the differential amplifier which is the nearest to and is smaller than the reference voltage $V_{ref}$ among the voltages outputted from the respective voltage modifying circuits 19$_1$–19$_n$. Thereby, when the analog input voltage $AN_{in}$ is larger than the reference voltage $V_{ref}$, the analog voltages not larger than the reference voltage $V_{ref}$ outputted from the differential amplifier are selected and supplied, as the modified input voltage $V_{MD}$, to the second input terminals of the comparators 13$_1$, 13$_2$ and 13$_3$.

More specifically, when the analog input voltage $AN_{in}$ is larger than the reference voltage $V_{ref}$, one of the switches $SW_1$–$SW_n$ is closed. When it is not larger than the reference voltage, only the switch $SW_0$ is closed. Thereby, the modified input voltage $V_{MD}$ not larger than the reference voltage $V_{ref}$ is always supplied to the comparators 13$_1$, 13$_2$ and 13$_3$. The control circuit 14 supplied with the voltage comparison result signal B applies it to the latch circuit 16 for outputting the signal B to the code terminal 17$_5$, as it is.

In this manner, the modified input voltage $V_{MD}$ is supplied to the second input terminals of the comparators 13$_1$, 13$_2$ and 13$_3$, and the first comparison is carried out.

When the modified input voltage $V_{MD}$ is larger than the comparison voltage selected by the analog multiplexer 12, the result of the first comparison is classified into the following four states (1), (2), (3) and (4) based on the modified input voltage $V_{MD}$ if the comparison output signals $C_1$, $C_2$ and $C_3$ of the comparators 13$_1$, 13$_2$ and 13$_3$ undergo a 0 to 1 transition.

State (1): $C_1$ is at "1" level.
State (2): $C_1$ is at "0" level, and $C_2$ is at "1" level.
State (3): $C_1$ and $C_2$ are at "0" level, and $C_3$ is at "1" level.
State (4): $C_3$ is at "0" level.

The result of the first comparison providing the state (1) is achieved when the modified input voltage $V_{MD}$ is larger than the comparison voltage $(23/32)V_{ref}$, and the control circuit 14 selects and outputs a digital code "1, 1, 1, 1," for performing the second comparison so as to select the connections a, b, and c quartering the voltage between the reference voltage $V_{ref}$ and the comparison voltage $(23/32)V_{ref}$ at the connection d. When this digital code is supplied to the analog multiplexer 12, the analog multiplexer 12 selects the comparison voltages $(29/32)V_{ref}$, $(27/32)V_{ref}$ and $(25/32)V_{ref}$ at the connections a, b and c shown in the Table 1. The selected comparison voltages are supplied to the comparators 13$_1$, 13$_2$ and 13$_3$, respectively. The comparators 13$_1$, 13$_2$ and 13$_3$ carry out the second comparison between the supplied comparison voltages and the modified input voltage $V_{MD}$.

In the second comparison, when all the comparison output signals $C_1$, $C_2$ and $C_3$ of the comparators 13$_1$, 13$_2$ and 13$_3$ are at the level of "1", the control circuit 14 determines that the modified input voltage $V_{MD}$ is larger than the comparison voltage at the connection a, and continues to output the same digital code "1, 1, 1, 1" as that previously outputted. Then, the latch circuit 16 temporarily stores the supplied digital code "1, 1, 1, 1", and then outputs it via the terminals 17$_1$–17$_4$. As a result, the second comparison performs the analog/digital conversion of the modified input voltage $V_{MD}$ into the digital code "1, 1, 1, 1".

Further, when the second comparison shows the result of the comparison output signal $C_1$ at "0" level and $C_2$ and $C_3$ at "1" level, the control circuit 14 determines that the modified input voltage $V_{MD}$ is smaller than the comparison voltage at the connection a but is larger than the comparison voltage $(27/32)V_{ref}$ at the connection b, and thus it changes only $2^{-3}$ and $2^{-4}$ of the digital code, which was previously outputted, into "1, 0" so as to select the connections b, c and d quartering the voltage between the comparison voltage $(29/32)V_{ref}$ at the connection a and the comparison voltage $(23/32)V_{ref}$ at the connection e, and outputs the same. Thus, the control circuit 14 outputs a digital code "1, 1, 1, 0".

When the second comparison provides the result of comparison output signals $C_1$ and $C_2$ at "0" level and $C_3$ at "1" level, the control circuit 14 determines that the modified input voltage $V_{MD}$ is smaller than the comparison voltage at the connection b but is larger than the comparison voltage $(25/32)V_{ref}$ at the connection c, and thus it changes only $2^{-3}$ and $2^{-4}$ of the digital code, which was previously outputted, into "0, 1" so as to select the connections c, d and e quartering the voltage between the comparison voltage $(27/32)V_{ref}$ at the connection b and the comparison voltage $(19/32)V_{ref}$ at the connection f, and outputs the same. Thus, the control circuit 14 outputs a digital code "1, 1, 0, 1".

When the second comparison provides the result of the comparison output signals $C_1$, $C_2$ and $C_3$ at "0" levels the control circuit 14 determines that the modified input voltage $V_{MD}$ is smaller than the comparison voltage at the connection c but is larger than the comparison voltage $(23/32)V_{ref}$ at the connection d, and thus it changes only $2^{-3}$ and $2^{-4}$ of the digital code, which was previously outputted, into "0, 0" so as to select the connections d, e and f quartering the voltage between the comparison voltage $(25/32)V_{ref}$ at the connection c and the comparison voltage $(17/32)V_{ref}$ at the connection g, and outputs the same. Thus, the control circuit 14 outputs a digital code "1, 1, 0, 0". After the second comparison, the latch circuit 16 temporarily stores the supplied digital code and thereafter outputs it via the code terminals $17_1$–$17_4$.

Meanwhile, when the result of the first comparison exhibits the state (2), i.e., $C_1$ at "0" level and $C_2$ at "1" level, the modified input voltage $V_{MD}$ is smaller than the comparison voltage $(23/32)V_{ref}$ at the connection d but is larger than the comparison voltage $(15/32)V_{ref}$ at the connection h. In this case, the control circuit 14 outputs a digital code "1, 0, 1, 1" for performing the second comparison so as to select the connections e, f and g quartering the voltage between the comparison voltage $(23/32)V_{ref}$ at the connection d and the comparison voltage $(15/32)V_{ref}$ at the connection h. When the digital code is supplied to the analog multiplexer 12, the analog multiplexer 12 selects the comparison voltages $(21/32)V_{ref}$, $(19/32)V_{ref}$ and $(17/32)V_{ref}$ at the connections e, f and g shown in the Table 1. The comparison voltages thus selected are supplied to the comparators $13_1$, $13_2$ and $13_3$, respectively. Thereafter, the comparators $13_1$, $13_2$ and $13_3$ perform the second comparison between the inputted comparison voltages and the modified input voltage $V_{MD}$, similarly to the aforementioned case.

In the second comparison, when all the comparison output signals $C_1$, $C_2$ and $C_3$ of the comparators $13_1$, $13_2$ and $13_3$ are at the "1" level, the control circuit 14 determines that the modified input voltage $V_{MD}$ is larger than the comparison voltage $(21/32)V_{ref}$ at the connection e, and continues to output the digital code "1, 0, 1, 1", which was previously outputted.

When the second comparison exhibits the result of the comparison output signals $C_1$ at "0" level and $C_2$ and $C_3$ at "1" level, the control circuit 14 determines that the modified input voltage $V_{MD}$ is smaller than the comparison voltage at the connection e but is larger than the comparison voltage $(19/32)V_{ref}$ at the connection f, and thus it changes only $2^{-3}$ and $2^{-4}$ of the digital code, which was previously outputted, into "1, 0" so as to select the connections f, g and h quartering the voltage between the comparison voltage $(21/32)V_{ref}$ at the connection e and the comparison voltage $(13/32)V_{ref}$ at the connection i, and outputs the same. Thus, the control circuit 14 outputs a digital code "1, 0, 1, 0".

When the second comparison exhibits the result of the comparison output signals $C_1$ and $C_2$ at "0" level and $C_3$ at "1" level, the control circuit 14 determines that the modified input voltage $V_{MD}$ is smaller than the comparison voltage at the connection f but is larger than the comparison voltage $(17/32)V_{ref}$ at the connection g, and thus it changes only $2^{-3}$ and $2^{-4}$ of the digital code, which was previously outputted, into "0, 1" so as to select the connections g, h and i quartering the voltage between the comparison voltage $(19/32)V_{ref}$ at the connection f and the comparison voltage $(11/32)V_{ref}$ at the connection j, and outputs the same. Thus, the control circuit 14 outputs a digital code "1, 0, 0, 1".

When the second comparison exhibits the result of comparison output signals $C_1$, $C_2$ and $C_3$ at "0" level, the control circuit 14 determines that the modified input voltage $V_{MD}$ is smaller than the comparison voltage at the connection g but is larger than the comparison voltage $(15/32)V_{ref}$ at the connection h, and thus it changes only $2^{-3}$ and $2^{-4}$ of the digital code, which was previously outputted, into "0, 0" so as to select the connections h, i and j quartering the voltage between the comparison voltage $(17/32)V_{ref}$ at the connection g and the comparison voltage $(9/32)V_{ref}$ at the connection k, and outputs the same. Thus, the control circuit 14 outputs a digital code "1, 0, 0, 0". After the second comparison, the digital code inputted into the latch circuit 16 during the second comparison is temporarily stored, and then is outputted via the terminals $17_1$–$17_4$.

The similar operation will be repeated. More specifically, when the result of comparison after the first comparison exhibits the state (3) or (4), the control circuit 14 outputs a digital code "0, 1, 1, 1" or "0, 0, 1, 1" and thereafter the analog multiplexer 12 selects the comparison voltages at the connections i–h, or the comparison voltages at the connections m–o. In accordance with the comparison output signals $C_1$, $C_2$ and $C_3$ of the comparators $13_1$, $13_2$ and $13_3$, the control circuit 14 outputs one of the digital codes of 4 bits shown in Table 1 similarly to the aforementioned case.

The voltage comparison result signals $B_1$–$B_n$ outputted from the comparators $20_1$–$20_n$ are supplied through the control circuit 14 to the latch circuit 16, and the latch circuit 16 temporarily stores the digital values thereof and outputs them via the terminal $17_5$ for forming the highest bits of the digital codes. As a result, the digital codes corresponding to the analog input voltage $AN_{in}$ are outputted to the code terminals $17_1$–$17_5$. After the second comparison is completed and the latch circuit 16 outputs the digital codes of 4 bits via the code terminals $17_1$–$17_4$, the control circuit 14 outputs the conversion end signal END via the control output terminal 18.

In this manner, the voltage modifying and comparing unit 30 outputs the voltage of $AN_{in}$–$kV_{ref}$, and allows the output of the voltage comparison result signal B resulting from the comparison between the voltage of $AN$–$kV_{ref}$ and the reference voltage $V_{ref}$. A value of "k" is determined, based on the voltage comparison result signal B, so as to satisfy the relationship of $0 \leq AN_{in} - kV_{ref} \leq V_{ref}$, i.e., the relationship that the result of subtraction of the value k times as large as the reference voltage $V_{ref}$ from the analog input voltage $AN_{in}$ is in the range between 0 and the reference voltage $V_{ref}$. The modified input voltage $V_{MD}$ based on the voltage comparison result signal B is supplied to the comparators $13_1$, $13_2$ and $13_3$. Therefore, even if the analog input voltage $AN_{in}$ is equal to or larger than the reference voltage $V_{ref}$, the comparators $13_1$, $13_2$ and $13_3$ are always supplied with the modified input voltage $V_{MD}$ not larger than the reference voltage $V_{ref}$. Accordingly, even if the analog input voltage $AN_{in}$ is larger than the reference voltage $V_{ref}$, the analog input voltage can be accurately converted into a digital value, similarly to the case where it is not larger than the reference voltage $V_{ref}$. The result of the conversion of the analog voltages exceeding the reference voltage into the digital value is represented with the higher four bits, and the result of the conversion of the analog voltages not larger than the reference voltage $V_{ref}$ into a digital value is represented with the lower four bits.

EMBODIMENT 2

Figure 4:
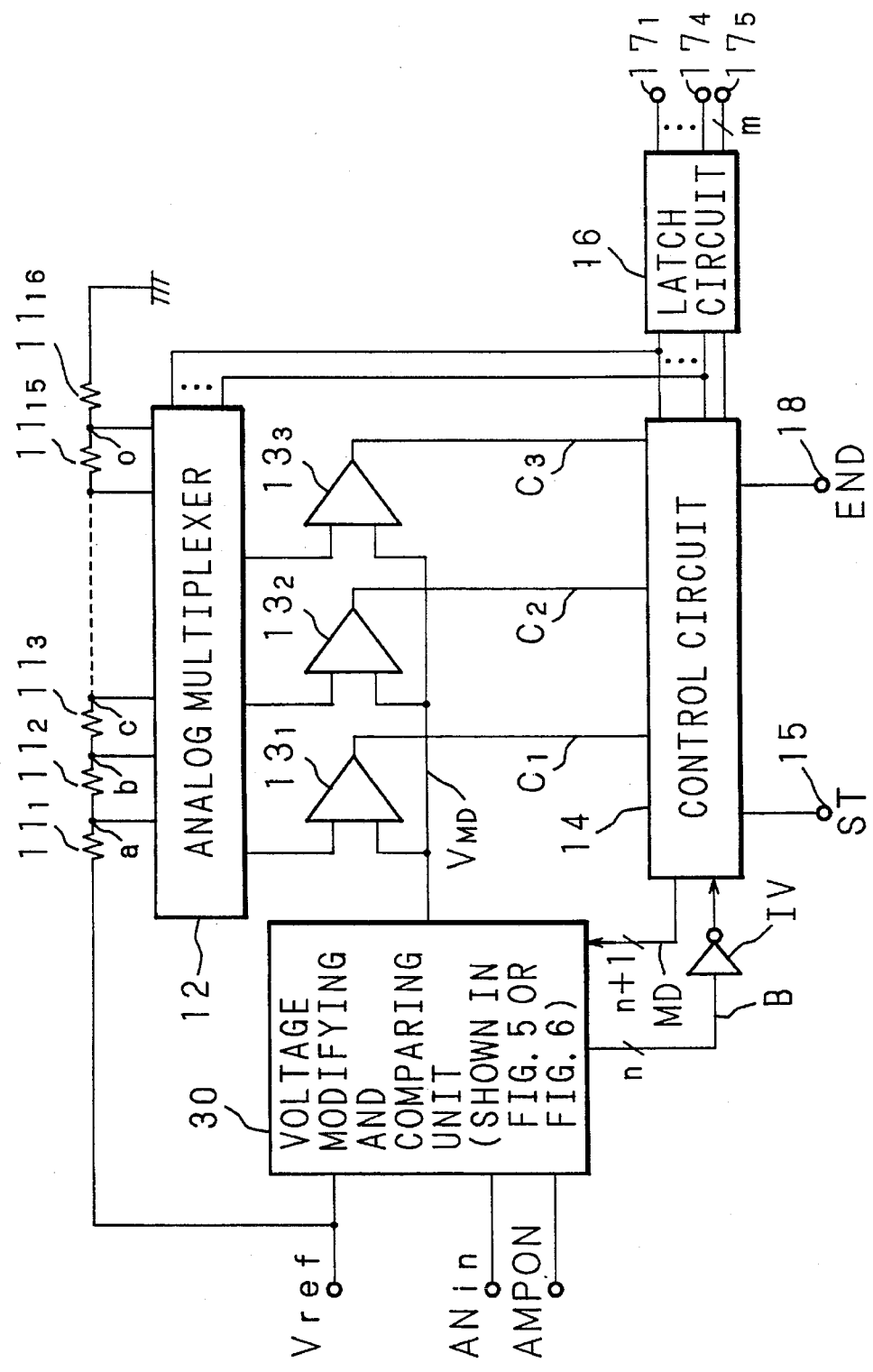
FIG. 4 is a block diagram showing the structure of an analog/digital converting circuit of embodiment 2 according to the invention.
Figure 5:
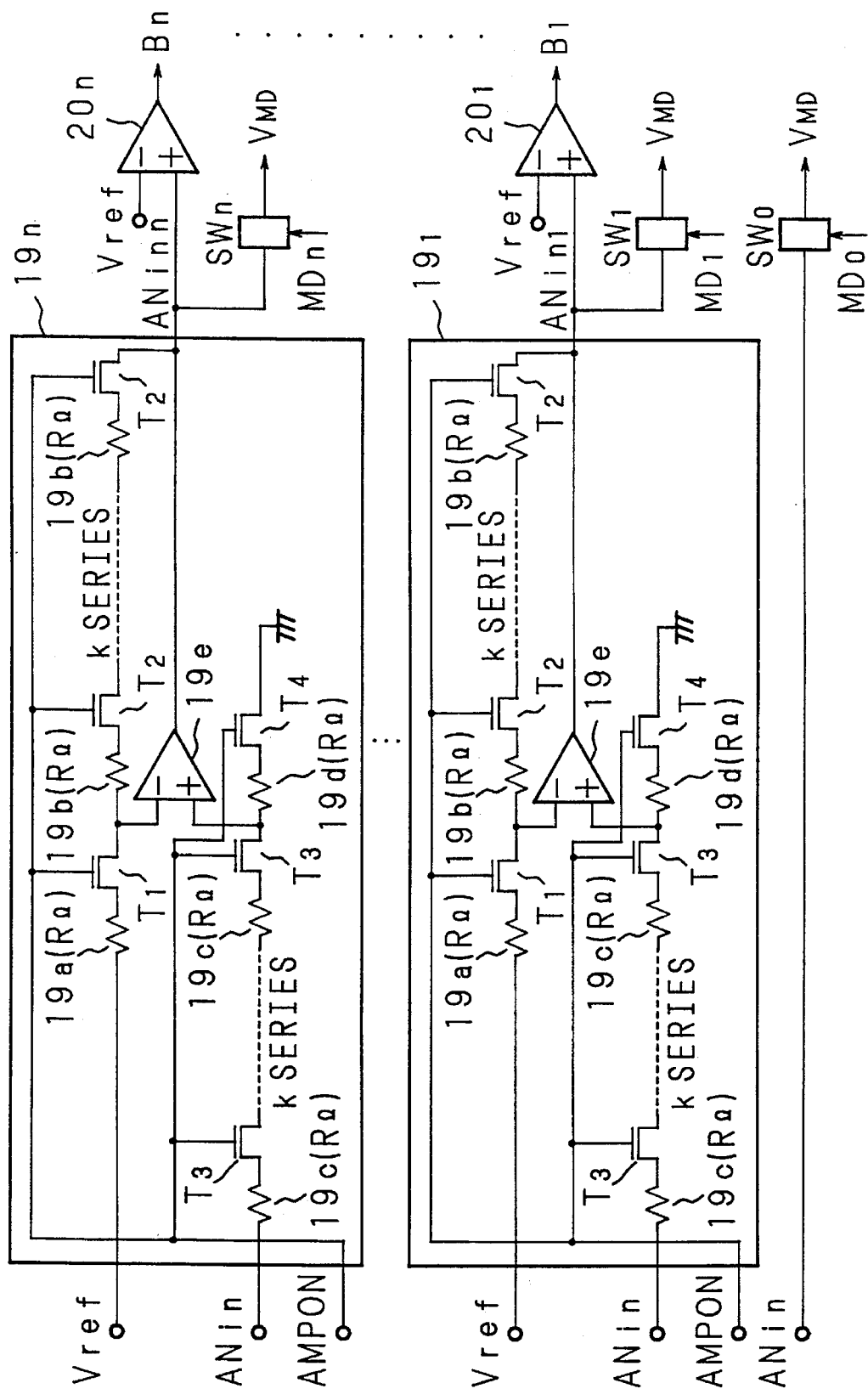
FIG. 5 is a block diagram showing the structure of a voltage modifying and comparing unit of embodiment 2.

FIG. 4 is a block diagram showing the structure of an analog/digital converting circuit of embodiment 2 according to the invention, and FIG. 5 is a block diagram showing the structure of a voltage modifying and comparing unit. In the circuit of FIG. 4, the voltage modifying and comparing unit 30 is supplied with an amplifier drive signal AMPON. This embodiment has the same structure as that shown in FIG. 2 except for the structure of the voltage modifying and comparing unit 30 which will be described below, and the same portions bear the same reference numbers.

In each of voltage modifying circuits $19_1$–$19_n$ shown in FIG. 5, the terminal receiving a reference voltage $V_{ref}$ is connected to the negative input terminal of a differential amplifier $19_e$ via a first circuit, i.e., a series circuit including a resistor $19_a$ and a transistor $T_1$, and the negative input terminal is connected to the output terminal of the differential amplifier $19_e$ via a second circuit, i.e., a circuit including k series circuits which are connected with one another in series and each of which includes a resistor $19_b$ and a transistor $T_2$. The terminal receiving an analog input voltage $AN_{in}$ is connected to the positive input terminal of the differential amplifier $19_e$ via a third circuit, i.e., a circuit including k series circuits, each of which includes a resistor $19_c$ and a transistor $T_3$. The positive input terminal is grounded via a fourth circuit, i.e., a series circuit including a resistor $19_d$ and a transistor $T_4$.

The resistors $19_a$, $19_b$, $19_c$ and $19_d$ have the same resistance of RΩ, and the transistors $T_1$–$T_4$ have the same size. The terminal receiving the amplifier drive signal AMPON is commonly connected to the gates of the transistors $T_1$, $T_2$, $T_3$ and $T_4$. The structure other than the above is the same as that of the voltage modifying and comparing unit 30 shown in FIG. 3, and the same portions bear the same reference numbers.

In the analog/digital converting circuit thus constructed, the amplifier drive signal AMPON is supplied to the voltage modifying and comparing unit 30 during the analog/digital converting operation. Thereby, all the transistors $T_1$, $T_2$, $T_3$ and $T_4$ in the voltage modifying circuits $19_1$–$19_n$ are turned on, and perform the same function as that of the voltage modifying circuits $19_1$–$19_n$ shown in FIG. 3, so that a voltage $AN_{in}$–$kV_{ref}$ is outputted from the differential amplifier $19_e$. Also in this case, therefore, the analog/digital converting operation can be performed similarly to embodiment 1.

When the analog/digital converting operation is not performed, the amplifier drive signal AMPON is controlled to turn off all the transistors $T_1$–$T_4$ to cut off the current through the resistors, so that the current consumption can be reduced. Owing to the provision of the transistors equal in number to the resistors, the on-resistances of the transistors contribute to the resistances of the respective resistors, so that the ratio of resistances of k resistors to that of one resistor is accurately equal to k, which improves the accuracy in the analog/digital conversion.

EMBODIMENT 3

Figure 6:
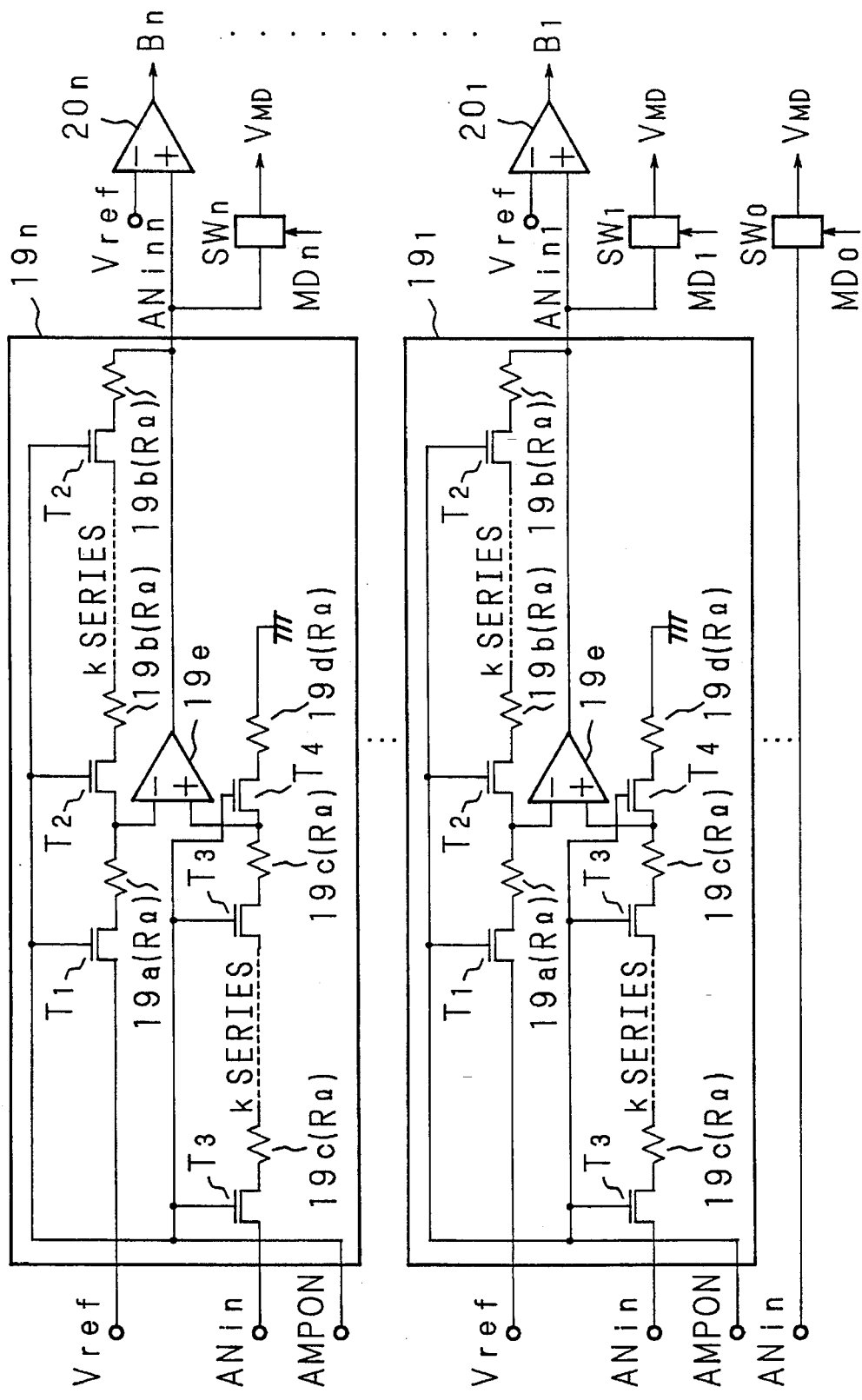
FIG. 6 is a block diagram showing the structure of an analog/digital converting circuit of embodiment 3 according to the invention.

FIG. 6 is a block diagram showing the structure of a voltage modifying and comparing unit of an analog/digital converting circuit of embodiment 3 according to the invention. In each of voltage modifying circuits $19_1$–$19_n$, the terminal receiving a reference voltage $V_{ref}$ is connected to the negative input terminal of a differential amplifier $19_e$ via a first circuit, i.e., a series circuit including a resistor $19_a$ and a transistor $T_1$, and the negative input terminal is connected to the output terminal of the differential amplifier $19_e$ via a second circuit, i.e., a circuit including k series circuits which are connected with one another in series and each of which includes a resistor $19_b$ and a transistor $T_2$. The terminal receiving an analog input voltage $AN_{in}$ is connected to the positive input terminal of the differential amplifier $19_e$ via a third circuit, i.e., a circuit including k series circuits, which are connected with one another in series and each of which includes a resistor $19_c$ and a transistor $T_3$. The positive input terminal is grounded via a fourth circuit, i.e., a series circuit including a resistor $19_d$ and a transistor $T_4$. Each of the resistors $19_a$, $19_b$, $19_c$ and $19_d$ has the same resistance of RΩ. The terminal receiving an amplifier drive signal AMPON is commonly connected to the gates of the transistors $T_1$, $T_2$, $T_3$ and $T_4$. The structure other than the above is the same as that of the voltage modifying and comparing unit 30 shown in FIG. 5, and the same portions bear the same reference numbers.

The voltage modifying and comparing unit thus constructed operates similarly to the voltage modifying and comparing unit shown in FIG. 5. Also, the analog/digital converting operation can be performed similarly to embodiments 1 and 2.

When the analog/digital converting operation is not performed, the amplifier drive signal AMPON is controlled to turn off all the transistors $T_1$–$T_4$ to cut off the current through the resistors, so that the current consumption can be reduced. Owing to the provision of the transistors equal in number to the resistors, the on-resistances of the transistors contribute to the resistances of the respective resistors, so that the ratio of resistances of k resistors to that of one resistor is accurately equal to k, which improves the accuracy in the analog/digital conversion. Further, the transistors in the circuits, which includes the transistor and the resistors connected in series and are grounded, are not arranged at the ground side. Accordingly, no influence is caused by the on-resistance due to the back-gate effect, and the same on-resistances as those of the other transistors can be obtained, whereby the ratio of the resistances of k resistors to that of one resistor can be set more accurately to k, and the accuracy in the analog/digital conversion can be further improved.

EMBODIMENT 4

Figure 7:
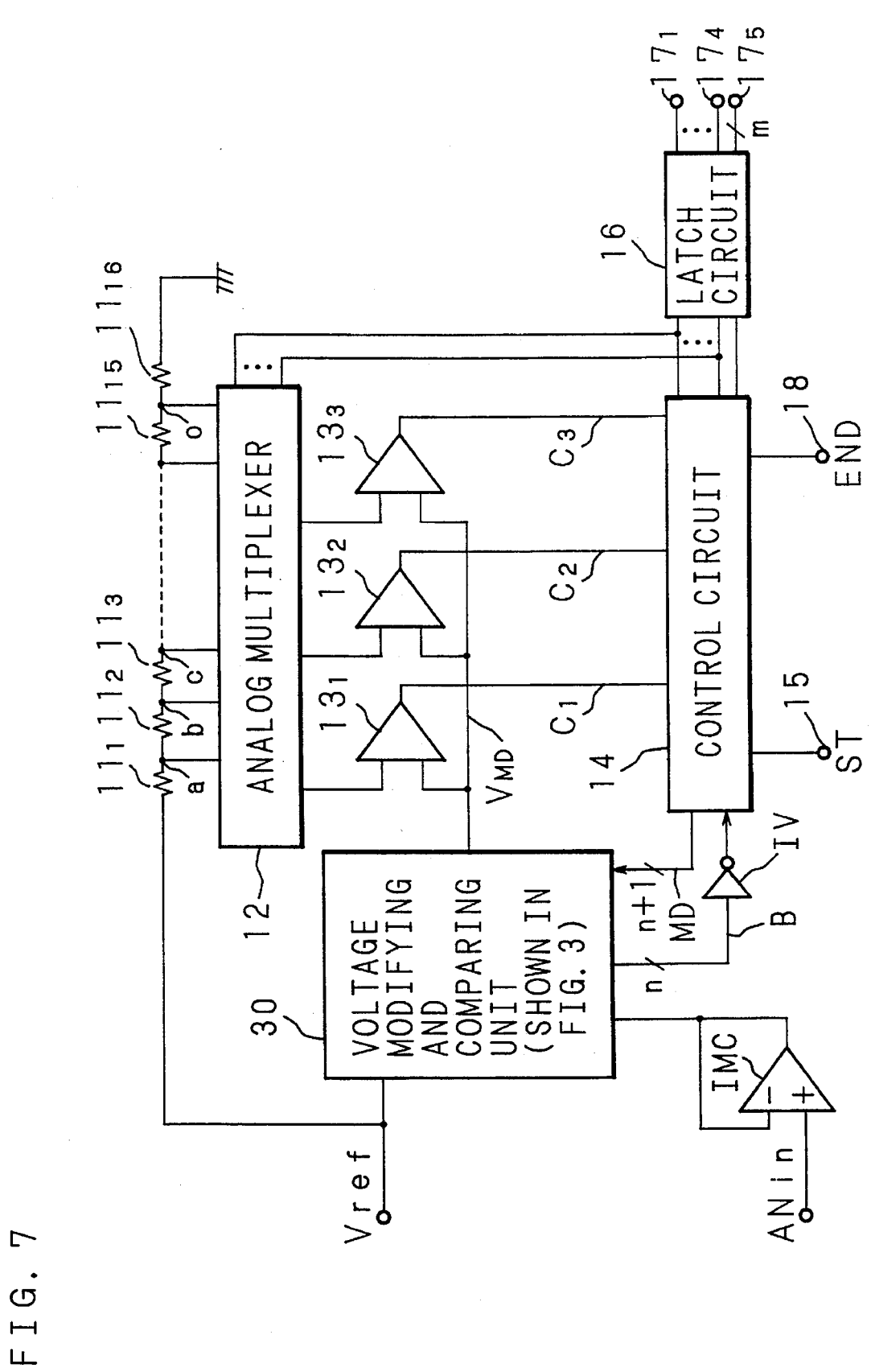
FIG. 7 is a block diagram showing the structure of an analog/digital converting circuit of embodiment 4 according to the invention.

FIG. 7 shows the structure of an analog/digital converting circuit of embodiment 4 according to the invention. The terminal receiving an analog input voltage $AN_{in}$ is connected to the positive input terminal of an impedance converter IMC such as a buffer. The negative input terminal of the impedance converter IMC is connected to the output terminal of the same. An analog input voltage outputted from the impedance converter IMC is supplied to a voltage modifying and comparing unit 30. The structure other than the above is the same as that of the analog/digital converting circuit shown in FIG. 2, and the same portions bear the same reference numbers. The voltage modifying and comparing unit 30 is formed of the voltage modifying and comparing unit shown in FIG. 3.

In the analog/digital converting circuit thus constructed, the analog input voltage $AN_{in}$ is supplied to the voltage modifying and comparing unit 30 via the impedance converter IMC, and the analog/digital converting operation is performed similarly to in the analog/digital converting circuit shown in FIG. 3.

In this case, since the output impedance of the impedance converter IMC is small, it is possible to prevent the analog input voltage from lowering, which otherwise may be caused by the change of the current flowing through the resistors $19_c$ and $19_d$ in the voltage modifying circuits $19_1$–$19_n$ (see FIG. 3), so that the accuracy in the analog/digital conversion can be stabilized.

EMBODIMENT 5

Figure 8:
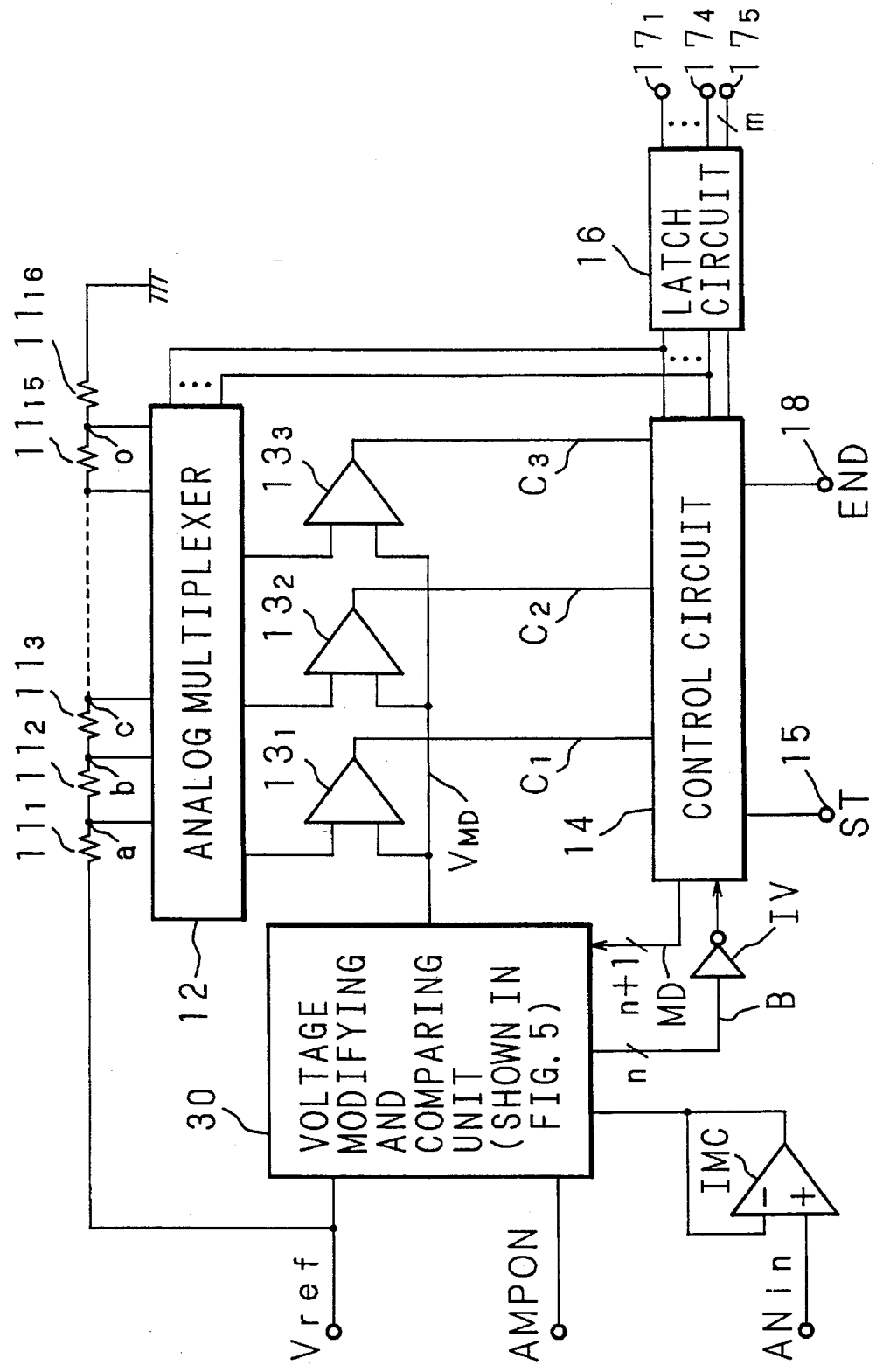
FIG. 8 is a block diagram showing the structure of an analog/digital converting circuit of embodiment 5 according to the invention.

FIG. 8 is a block diagram showing an analog/digital converting circuit of embodiment 5 according to the invention. The terminal receiving an analog input voltage $AN_{in}$ is connected to the positive input terminal of the impedance converter IMC such as a buffer. The negative input terminal of the impedance converter IMC is connected to the output terminal of the same. The analog input voltage outputted from the impedance converter IMC is supplied to the voltage modifying and comparing unit 30. The structure other than the above is the same as that of the analog/digital converting circuit shown in FIG. 4, and the same portions bear the same reference numbers. The voltage modifying and comparing unit 30 is formed of the voltage modifying and comparing unit shown in FIG. 5.

In the analog/digital converting circuit thus constructed, the analog/digital converting operation is performed similarly to the aforementioned case.

In this case, the current consumption in the voltage modifying circuits $19_1$–$19_n$ (see FIG. 5) can also be reduced as already described. The accuracy in the analog/digital conversion can be also improved. Further, in the voltage modifying circuits $19_1$–$19_n$, the analog input voltage can be prevented from lowering even if the current flowing through the resistor changes.

EMBODIMENT 6

Figure 9:
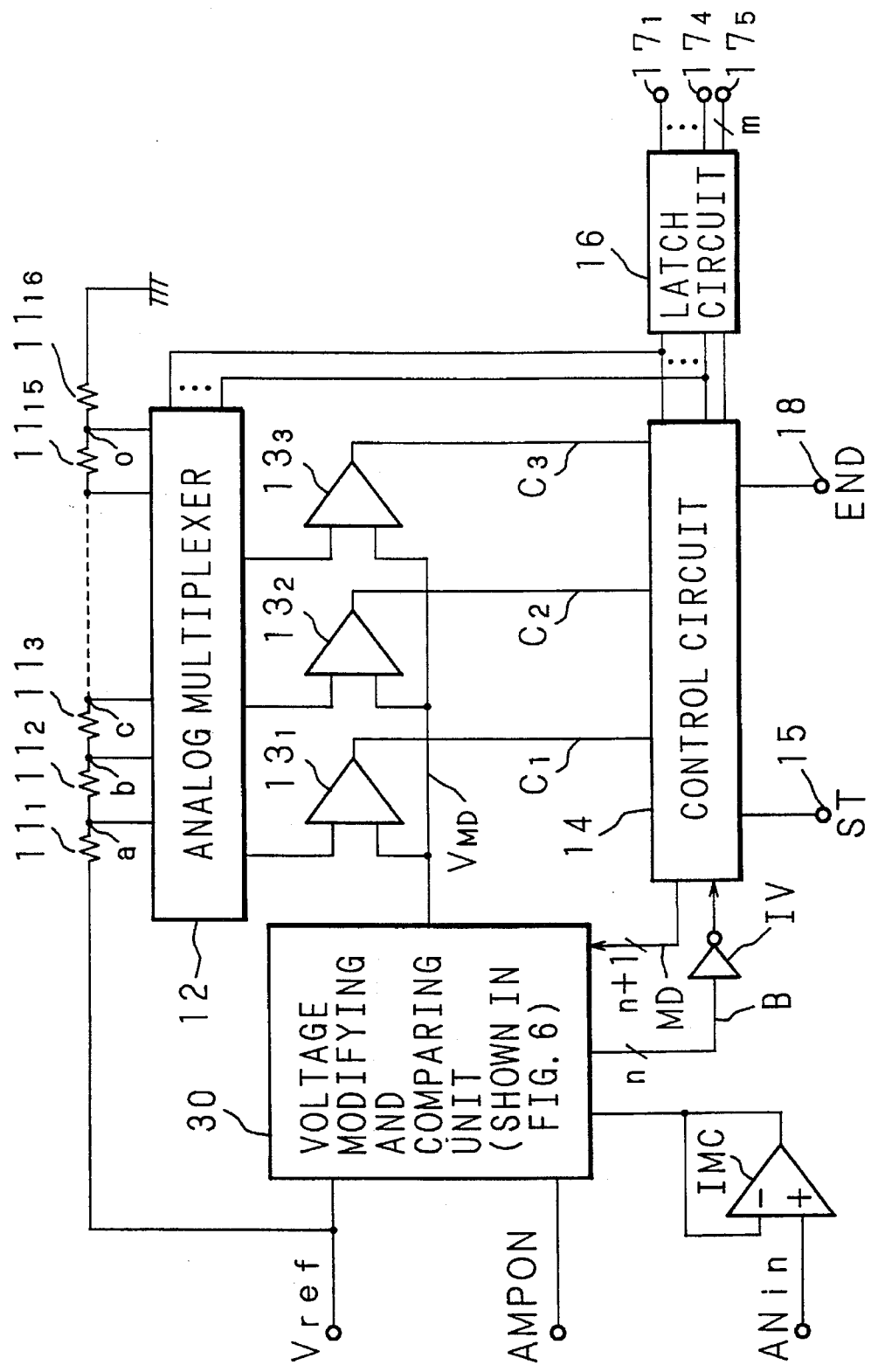
FIG. 9 is a block diagram showing the structure of an analog/digital converting circuit of embodiment 6 according to the invention.

FIG. 9 is a block diagram showing the structure of an analog/digital converting circuit of embodiment 6 according to the invention. This structure is similar to that of the analog/digital converting circuit shown in FIG. 8, and the same portions bear the same reference numbers. The voltage modifying and comparing unit 30 is formed of the voltage modifying and comparing unit shown in FIG. 4.

The analog/digital converting circuit thus constructed performs the analog/digital converting operation similarly to the aforementioned cases. Also in this case, the current consumption in the voltage modifying circuits $19_1$–$19_n$ (see FIG. 4) can be reduced. Influence by the back-gate effect of the transistors can be prevented, so that the accuracy in the analog/digital conversion can be further improved. Further, the analog input voltage can also be prevented from lowering even if the current flowing through the voltage modifying circuit changes.

EMBODIMENT 7

Figure 10:
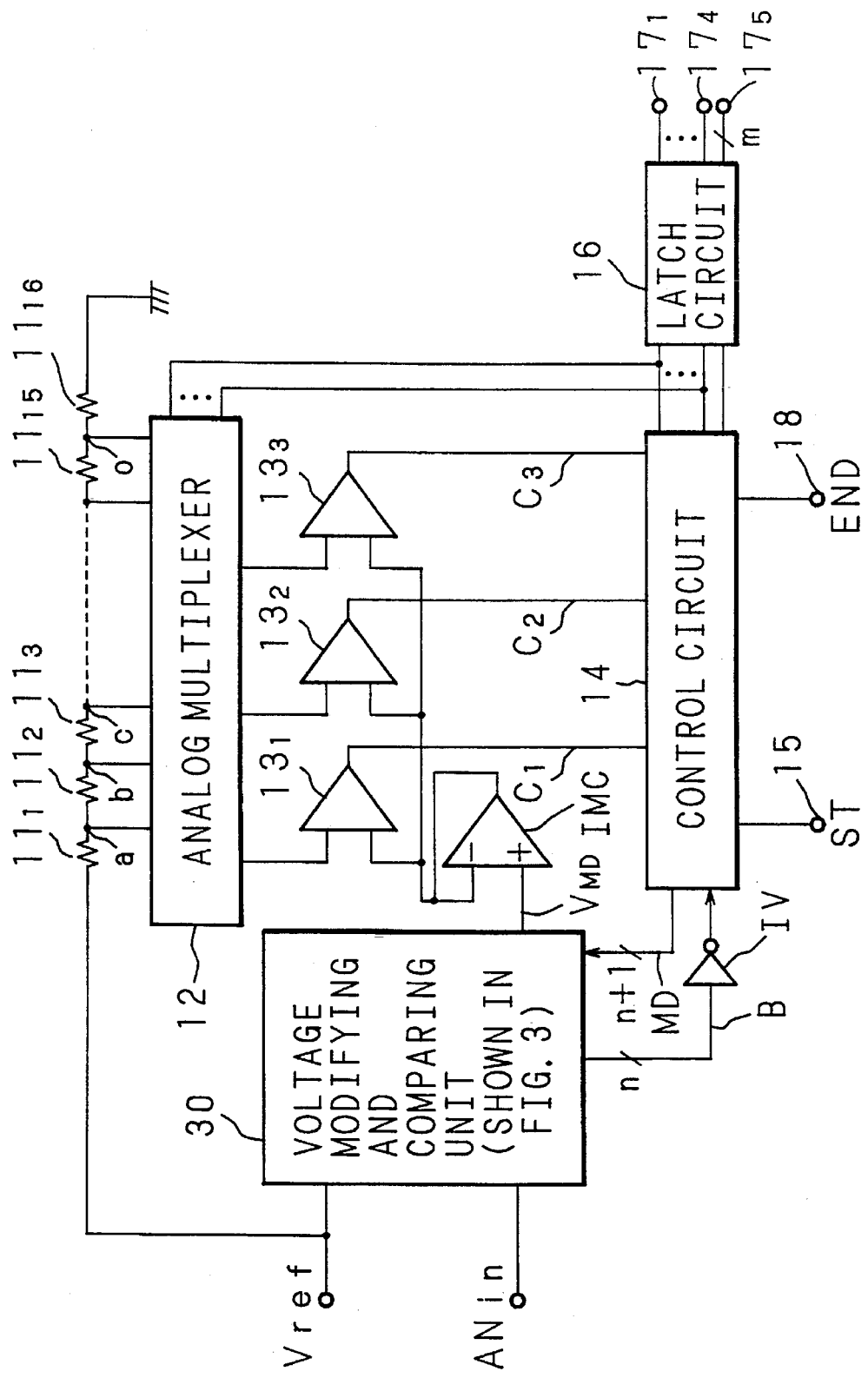
FIG. 10 is a block diagram showing the structure of an analog/digital converting circuit of embodiment 7 according to the invention.

FIG. 10 is a block diagram showing the structure of an analog/digital converting circuit of embodiment 7 according to the invention. A modified input voltage $V_{MD}$ outputted from a voltage modifying and comparing unit 30 is inputted to the positive input terminal of an impedance converter IMC such as a buffer. The negative input terminal of the impedance converter IMC is connected to the output terminal of the same. The modified input voltage outputted from the impedance IMC is supplied to second input terminal of the comparators $13_1$, $13_2$ and $13_3$. The structure other than the above is the same as that of the analog/digital converting circuit shown in FIG. 2, and the same portions bear the same reference numbers. The voltage modifying and comparing unit 30 is formed of the voltage modifying and comparing unit shown in FIG. 3.

The analog/digital converting circuit thus constructed performs the analog/digital converting operation similarly to the aforementioned case.

Also in this case, it is possible to prevent the modified input voltage $V_{MD}$ outputted from the impedance converter IMC from lowering even if the currents flowing through the comparators $13_1$, $13_2$ and $13_3$ (see FIG. 3) change. Therefore, the accuracy in the analog/digital conversion can be stabilized.

EMBODIMENT 8

Figure 11:
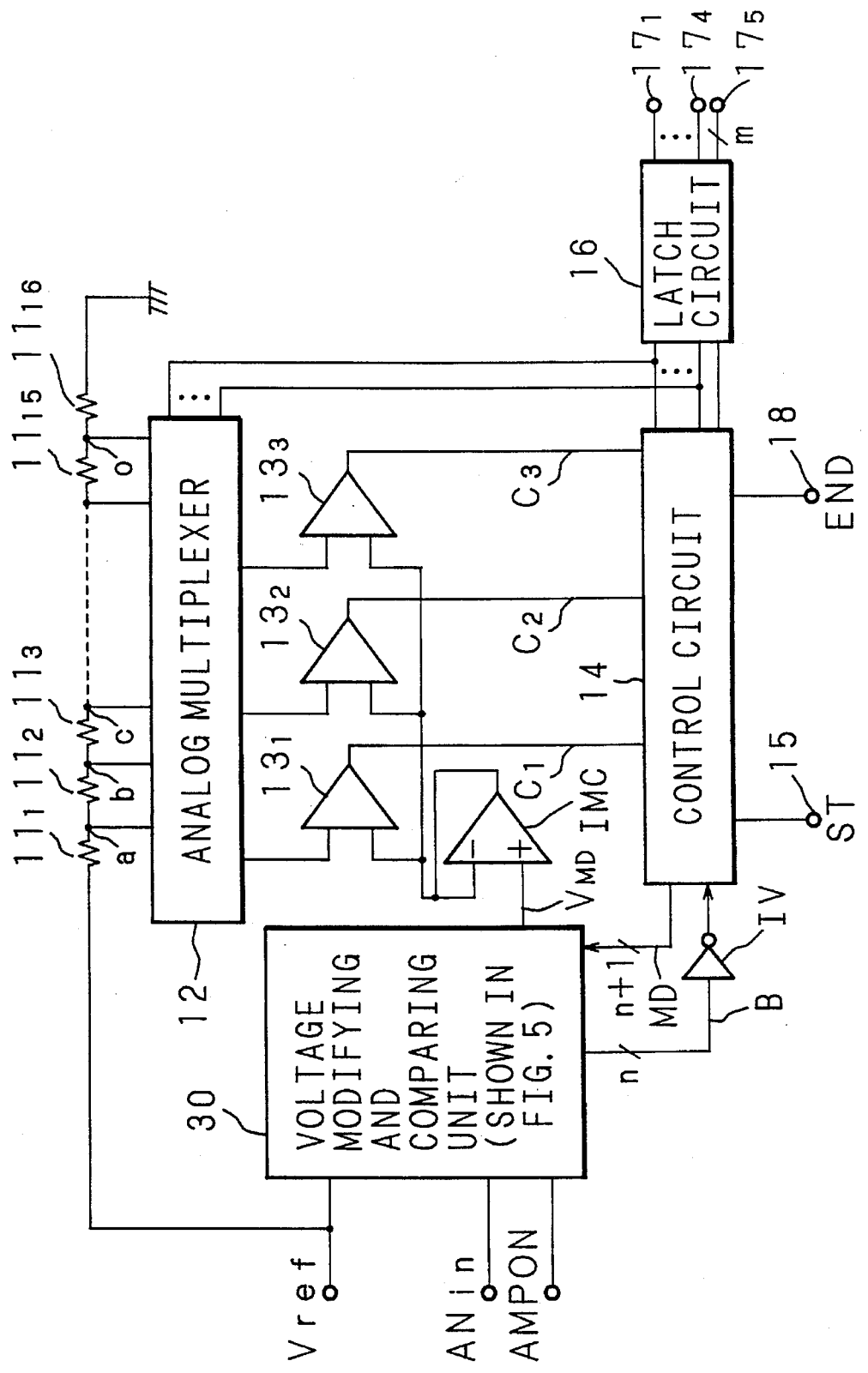
FIG. 11 is a block diagram showing the structure of an analog/digital converting circuit of embodiment 8 according to the invention.

FIG. 11 is a block diagram showing the structure of an analog/digital converting circuit of embodiment 8 according to the invention. A modified input voltage $V_{MD}$ outputted from the voltage modifying and comparing unit 30 is inputted to the positive input terminal of an impedance converter IMC. The modified input voltage outputted from the impedance IMC is supplied to second input terminals of the comparators $13_1$, $13_2$ and $13_3$. The structure other than the above is the same as that of the analog/digital converting circuit shown in FIG. 4, and the same portions bear the same reference numbers. The voltage modifying and comparing unit 30 is formed of the voltage modifying and comparing unit shown in FIG. 5.

The analog/digital converting circuit thus constructed performs the analog/digital converting operation similarly to the aforementioned case.

In this case, when the analog/digital converting operation is not performed, the current through the voltage modifying circuits $19_1$–$19_n$ can be cut, so that the current consumption can be reduced. Owing to the provision of the transistors equal in number to the resistors, the accuracy in the analog/digital conversion can be improved. Further, owing to the provision of the impedance converter IMC, it is possible to prevent the modified input voltage from lowering, which otherwise may be caused by the change of the currents flowing through the comparators.

EMBODIMENT 9

Figure 12:
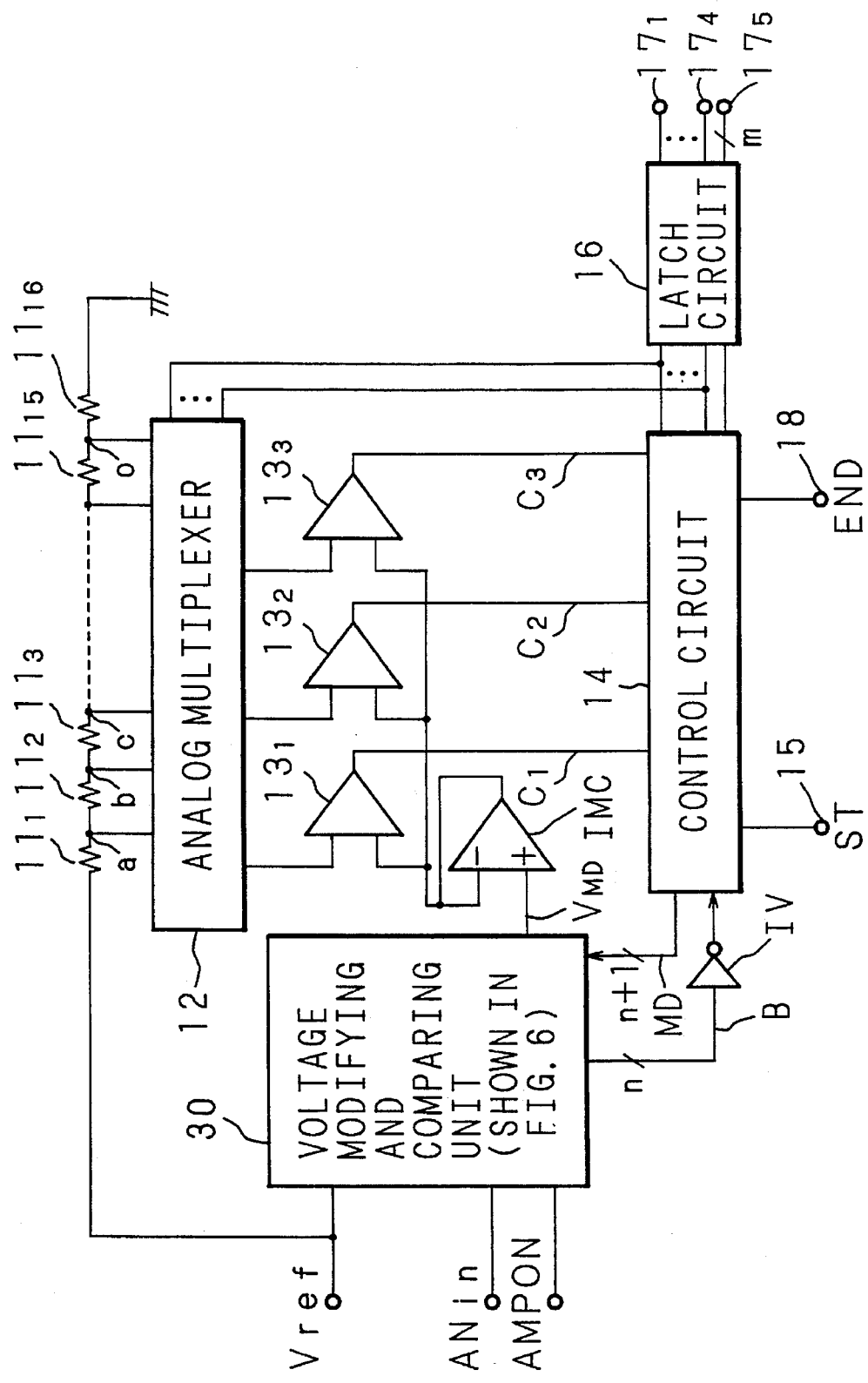
FIG. 12 is a block diagram showing the structure of an analog/digital converting circuit of embodiment 9 according to the invention.

FIG. 12 is a block diagram showing the structure of an analog/digital converting circuit of embodiment 9 according to the invention. This structure is similar to that of the analog/digital converting circuit shown in FIG. 11. The voltage modifying and comparing unit 30 is formed of the voltage modifying and comparing unit shown in FIG. 6. The analog/digital converting circuit thus constructed performs the analog/digital converting operation similarly to the aforementioned case.

In this case, when the analog/digital converting operation is not performed, the current through the voltage modifying circuits $19_1$–$19_n$ can be cut, so that the current consumption can be reduced. Since the transistor $T_4$ is provided at the side not directly grounded, the on-resistance equal to those of the other transistors can be obtained without being influenced by the back-gate effect, so that the accuracy in the analog/digital conversion can be improved.

Further, owing to the provision of the impedance converter IMC, it is possible to prevent the modified input voltage $V_{MD}$ supplied to the comparators $13_1$, $13_2$ and $13_3$ from lowering, which otherwise may be caused by the change of the current flowing through the comparators $13_1$, $13_2$ and $13_3$.

The embodiments have been described in connection with the conversion accuracy of 4 bits, which is, of course, merely an example.

As described above, the invention can provide an analog/digital converting circuit which can process an analog input voltage exceeding the reference voltage to accurately convert the analog input voltage into a digital value.

When the analog/digital conversion is not performed, the current consumption in a voltage modifying circuit can be reduced. Further, an analog input voltage is supplied to the voltage modifying and comparing unit via an impedance converter, so that it is possible to prevent the analog input voltage supplied to the voltage modifying and comparing unit from lowering. Further, the analog voltage supplied from the voltage modifying and comparing unit is outputted via the impedance converter, so that reduction of the analog voltage to be compared with the comparator voltage can be prevented. In this manner, the analog/digital converting circuit of the invention exhibits various excellent effects.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such mates and bounds thereof are therefore intended to be embraced by the claims.

What is claimed is:

1. An analog/digital converting circuit for converting an analog input voltage into a digital value based on comparison voltages generated by dividing a reference voltage, comprising:

a voltage modifying and comparing unit which modifies said analog input voltage when said analog input voltage exceeds said reference voltage to generate a plurality of analog voltages having values different from that of said analog input voltage, and compares each of said analog voltages with said reference voltage to generate a voltage comparison result signal;

a control unit which is supplied with said voltage comparison result signal and outputs to said voltage modifying and comparing unit a voltage select signal indicating selection from said analog voltages based on said voltage comparison result signal, said voltage modifying and comparing unit being responsive to said voltage select signal to output a selected analog voltage; and a comparator which is supplied with said selected analog voltage, and compares said selected analog voltage with at least one of said comparison voltages.

2. An analog/digital converting circuit according to claim 1, wherein said voltage modifying and comparing unit includes:

a voltage modifying unit which modifies said analog input voltage to generate said plurality of analog voltages having the values different from that of said analog input voltage;

a voltage comparing unit which compares each of said analog voltages with said reference voltage, and outputs said voltage comparison result signal to said control unit; and a switching element portion which controls an output of the selected analog voltage to said comparator based on said voltage select signal supplied from said control unit.

3. An analog/digital converting circuit according to claim 1, wherein said voltage modifying and comparing unit includes:

first and second resistors connected in series with each other;

third and fourth resistors connected in series with each other; and an operation amplifier which has one input terminal connected to a connecting portion between said first and second resistors, an output terminal connected to said one input terminal with said second resistor therebetween, and another input terminal connected to a connecting portion between said third and fourth resistors, said another input terminal being grounded via said fourth resistor, and each of said first and fourth resistors has a resistance different from a resistance of each of said second and third resistors.

4. An analog/digital converting circuit according to claim 3, further comprising an impedance converter through which said analog input voltage is applied to said voltage modifying and comparing unit.

5. An analog/digital converting circuit according to claim 3, further comprising an impedance converter interposed between said voltage modifying and comparing unit and said comparator.

6. An analog/digital converting circuit according to claim 1, further comprising an impedance converter through which said analog input voltage is applied to said voltage modifying and comparing unit.

7. An analog/digital converting circuit according to claim 1, further comprising an impedance converter interposed between said voltage modifying and comparing unit and said comparator.

8. The analog/digital converting circuit of claim 1, wherein said voltage modifying and comparing unit includes:

a means responsive to said voltage comparison result signal for outputting said analog input voltage to said comparator when said analog input voltage is less than said reference voltage.

9. The analog/digital converting circuit of claim 8, wherein said means responsive to said voltage comparison result signal comprises:

a switch element which controls the application of said analog input voltage to said comparator based on said voltage select signal supplied from said control unit.

10. An analog/digital converting circuit for converting an analog input voltage into a digital value based on comparison voltages generated by dividing a reference voltage, comprising:

a voltage modifying and comparing unit which modifies said analog input voltage when said analog input voltage exceeds said reference voltage to generate a plurality of analog voltages having values different from that of said analog input voltage, and compares each of said analog voltages with said reference voltage to generate a voltage comparison result signal;

a control unit which is supplied with said voltage comparison result signal and outputs to said voltage modifying and comparing unit a voltage select signal indicating selection from said analog voltages based on said voltage comparison result signal, said voltage modifying and comparing unit being responsive to said voltage select signal to output a selected analog voltage;

a comparator which is supplied with said selected analog voltage, and compares said selected analog voltage with at least one of said comparison voltages; and further comprising a terminal receiving a signal for supplying/cutting said analog input voltage and said reference voltage.

11. An analog/digital converting circuit for converting an analog input voltage into a digital value based on comparison voltages generated by dividing a reference voltage, comprising:

a voltage modifying and comparing unit which modifies said analog input voltage when said analog input voltage exceeds said reference voltage to generate a plurality of analog voltages having values different from that of said analog input voltage, and compares each of said analog voltages with said reference voltage to generate a voltage comparison result signal;

a control unit which is supplied with said voltage comparison result signal and outputs to said voltage modifying and comparing unit a voltage select signal indicating selection from said analog voltages based on said voltage comparison result signal, said voltage modifying and comparing unit being responsive to said voltage select signal to output a selected analog voltage;

a comparator which is supplied with said selected analog voltage, and compares said selected analog voltage with at least one of said comparison voltages;

a terminal receiving a signal for supplying/cutting said analog input voltage and said reference voltage;

wherein said voltage modifying and comparing unit includes:

first and third circuits, each having a resistor and a transistor connected with each other in series;

second and fourth circuits, each having a plurality of series circuits connected in further series with one another, and each of said plurality of series circuits including a resistor and a transistor; and an operation amplifier having one input terminal connected to a connecting portion between said first and second circuits, an output terminal connected to said one input terminal with said second circuit therebetween, and another input terminal connected to a connecting portion between said third and fourth circuits and grounded via said fourth circuit; and said resistors have the same resistance.

12. An analog/digital converting circuit according to claim 11, wherein the transistors in said fourth circuit are not directly grounded.

13. An analog/digital converting circuit according to claim 12, further comprising an impedance converter through which said analog input voltage is applied to said voltage modifying and comparing unit.

14. An analog/digital converting circuit according to claim 12, further comprising an impedance converter interposed between said voltage modifying and comparing unit and said comparator.

15. An analog/digital converting circuit according to claim 11, further comprising an impedance converter through which said analog input voltage is applied to said voltage modifying and comparing unit.

16. An analog/digital converting circuit according to claim 11, further comprising an impedance converter interposed between said voltage modifying and comparing unit and said comparator.

* * * * *